United States Patent
Matsushita et al.

(10) Patent No.: US 7,402,938 B2
(45) Date of Patent: Jul. 22, 2008

(54) PIEZOELECTRIC SINGLE CRYSTAL DEVICE

(75) Inventors: Mitsuyoshi Matsushita, Chiba (JP); Yosuke Iwasaki, Chiba (JP)

(73) Assignee: JFE Mineral Co., Ltd., Tokyo (JP)

( * ) Notice: Subject to any disclaimer, the term of this patent is extended or adjusted under 35 U.S.C. 154(b) by 508 days.

(21) Appl. No.: 11/257,159

(22) Filed: Oct. 25, 2005

(65) Prior Publication Data

US 2006/0091353 A1    May 4, 2006

(30) Foreign Application Priority Data

Oct. 29, 2004   (JP)   ............... 2004-316803

(51) Int. Cl.
*H01L 41/187* (2006.01)
(52) U.S. Cl. ............... 310/358; 252/62.9 PZ; 501/134
(58) Field of Classification Search ......... 310/358; 252/62.9 PZ, 62.9 R; 501/134
See application file for complete search history.

(56) References Cited

U.S. PATENT DOCUMENTS

| | | | | |
|---|---|---|---|---|
| 4,689,517 A * | 8/1987 | Harnden et al. | ............. | 310/332 |
| 4,714,847 A * | 12/1987 | Harnden et al. | ............. | 310/332 |
| 5,763,983 A * | 6/1998 | Huang | ........................ | 310/360 |
| 5,804,907 A * | 9/1998 | Park et al. | .................... | 310/358 |
| 5,804,908 A * | 9/1998 | Yano | ........................... | 310/358 |
| 5,998,910 A | 12/1999 | Park et al. | | |
| 6,231,779 B1 * | 5/2001 | Chiang et al. | ........... | 252/62.9 R |
| 6,238,481 B1 * | 5/2001 | Yamashita et al. | ............ | 117/84 |
| 6,545,387 B2 * | 4/2003 | Lee et al. | ............... | 310/313 A |
| 7,015,628 B2 * | 3/2006 | Matsushita et al. | .......... | 310/358 |
| 7,309,949 B2 * | 12/2007 | Kashiwaya et al. | ......... | 310/358 |
| 7,309,950 B1 * | 12/2007 | Aoki et al. | ................... | 310/358 |
| 2003/0164137 A1 * | 9/2003 | Han | ............................ | 117/81 |
| 2003/0178914 A1 * | 9/2003 | Ogawa et al. | ............... | 310/311 |
| 2004/0232803 A1 * | 11/2004 | Matsushita et al. | .......... | 310/358 |
| 2005/0109263 A9 * | 5/2005 | Chiang et al. | ................. | 117/47 |
| 2005/0194868 A1 * | 9/2005 | Kashiwaya et al. | ......... | 310/358 |
| 2007/0108876 A1 * | 5/2007 | Ogawa | ....................... | 310/358 |
| 2007/0152182 A1 * | 7/2007 | Yasuda et al. | ......... | 252/62.9 PZ |
| 2007/0228896 A1 * | 10/2007 | Matsushita | ................... | 310/368 |
| 2007/0267947 A1 * | 11/2007 | Matsushita et al. | ......... | 310/358 |

* cited by examiner

*Primary Examiner*—Thomas M Dougherty
(74) *Attorney, Agent, or Firm*—Oliff & Berridge, PLC

(57) ABSTRACT

A piezoelectric single crystal device is provided exhibiting excellent piezoelectric properties, within a specific high-temperature range of $Tr_{rt}°$ C. to $(T_{rt}-20)°$ C., where $T_{rt}$ represents a transformation temperature between a pseudocubic system and a tetragonal system. Specifically, the piezoelectric single crystal device is composed of a single crystal having a composition represented by $[Pb(Mg,Nb)O_3]_{(1-X)} \cdot [PbTiO_3]_{(X)}$, where X is within the range of 0.26 to 0.29 and having a complex perovskite structure, wherein a specific inductive capacity at 25° C. is 5,000 or more, and a specific inductive capacity at the transformation temperature between a pseudocubic system and a tetragonal system of the above-described single crystal is 2.5 times or more larger than the specific inductive capacity at 25° C.

7 Claims, 7 Drawing Sheets

○ : OXYGEN ION
◍ : R ION
● : M ION

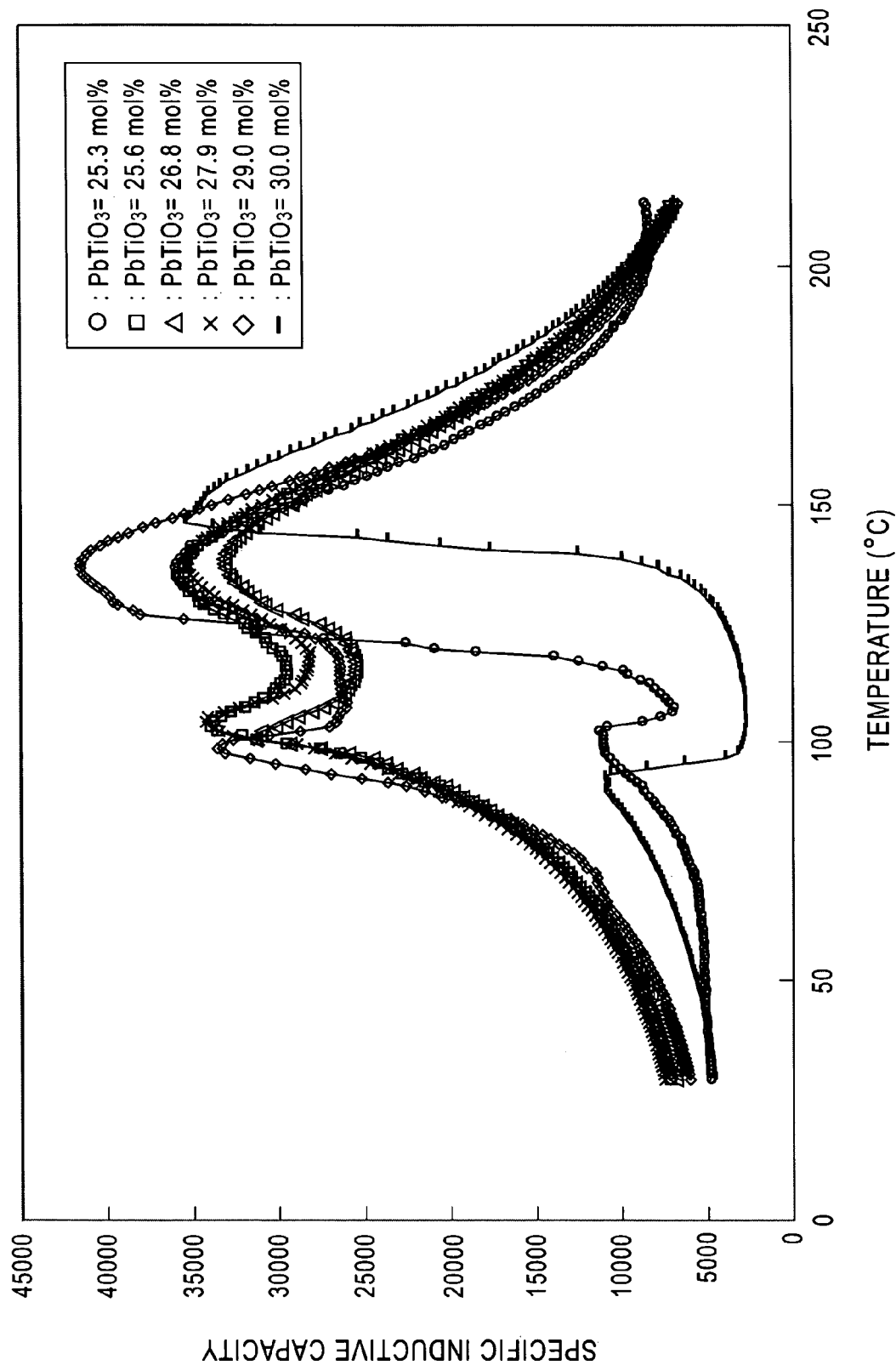

PIEZOELECTRIC SINGLE CRYSTAL DEVICE

BACKGROUND

The present invention relates to a piezoelectric single crystal device. In particular, it relates to a piezoelectric single crystal device capable of exhibiting piezoelectric properties with high sensitivity, even when used at temperatures higher than room temperature, specifically, within a specific high-temperature range of $T_{rt}°$ C. to $(T_{rt}-20)°$ C. (for example, about 50° C. to 70° C.) where $T_{rt}$ represents a transformation temperature (may be referred to as a phase transition temperature) between a pseudocubic system and a tetragonal system.

A piezoelectric single crystal device makes the conversion between electric energy and mechanical energy possible, and is widely used for applications such as, for example, accurate positioning actuators of magnetic heads, piezoelectric gyro devices, image stabilizers of digital still cameras, and cardiac pacemaker sensors.

The above-described piezoelectric single crystal device, including a solid solution of $[Pb(Mg,Nb)O_3]_{(1-X)}\cdot[PbTiO_3]_{(X)}$ (referred to as PMN-PT or PMNT) made of lead magnesium niobate and lead titanate and serving as a material for the single crystal has been previously known.

For example, U.S. Pat. No. 5,998,910 discloses a transducer having a composition represented by $Pb(Mg_{1/3}Nb_{2/3})_{1-y}Ti_yO_3$, that includes a single crystal exhibiting excellent piezoelectric properties in a <001> direction of a pseudocubic system, and capable of exhibiting piezoelectric properties with high sensitivity.

The piezoelectric properties of the piezoelectric single crystal device can be evaluated based on values of the specific inductive capacity $\epsilon_r$ and the piezoelectric constant $d_{33}$, and increases in these values generally indicate improvements of the piezoelectric properties of the single crystal device. The specific inductive capacity $\epsilon_r$ and the piezoelectric constant $d_{33}$ vary depending on temperatures. However, these parameters are in a proportional relationship when the temperature is constant.

A piezoelectric single crystal device having a composition made of lead magnesium niobate and lead titanate exhibits excellent piezoelectric properties within a specific high-temperature range of $T_{rt}°$ C. to $(T_{rt}-20)°$ C. (for example, about 50° C. to 70° C.) as compared with the piezoelectric properties at room temperature.

Therefore, in the case where the piezoelectric single crystal device has the above-described composition, using the single crystal device within the specific high-temperature range described above (for example, about 50° C. to 70° C.), is advantageous to exhibit excellent piezoelectric properties.

However, the transducer described in U.S. Pat. No. 5,998,910 exhibits a specific inductive capacity in the order of 13,000 even at the maximum within the above-described specific high-temperature range and a small specific inductive capacity at room temperature (about 30° C.) of less than 5,000.

SUMMARY

It is an object of the present invention to provide a piezoelectric single crystal device exhibiting excellent piezoelectric properties, particularly at temperatures higher than room temperature, specifically within a specific high-temperature range of $T_{rt}°$ C. to $(T_{rt}-20)°$ C. (for example, about 50° C. to 70° C.) where $T_{rt}$ represents a transformation temperature between a pseudocubic system and a tetragonal system by using a single crystal composed of $[Pb(Mg,Nb)O_3]_{(1-X)}\cdot[PbTiO_3]_{(X)}$ having a compositional ratio within a specific narrow range.

The configuration of the present invention to achieve the above-described object includes the following features.

(1) A piezoelectric single crystal device composed of a single crystal having a composition represented by $[Pb(Mg,Nb)O_3]_{(1-X)}\cdot[PbTiO_3]_{(X)}$, where X is within the range of 0.26 to 0.29, and having a complex perovskite structure, wherein a specific inductive capacity at 25° C. is 5,000 or more, and a specific inductive capacity at a transformation temperature between a pseudocubic system and a tetragonal system of the above-described single crystal is 2.5 times or more larger than the specific inductive capacity at 25° C.

(2) The piezoelectric single crystal device according to the above-described item (1), wherein a molar ratio of Mg to Nb in the above-described single crystal is within the range of 0.45 to 0.55.

(3) The piezoelectric single crystal device according to the above-described item (1) or item (2), wherein the specific inductive capacity at the transformation temperature between a pseudocubic system and a tetragonal system of the above-described single crystal is 20,000 or more.

(4) The piezoelectric single crystal device according to any one of the above-described items (1) to (3), the piezoelectric single crystal device formed by polarizing the above-described single crystal of pseudocubic system in a <100> direction, wherein X in the formula described above is within the range of 0.27 to 0.29, and the specific inductive capacity at 25° C. is 6,500 or more.

(5) The piezoelectric single crystal device according to any one of the above-described items (1) to (3), the piezoelectric single crystal device formed by polarizing the single crystal of pseudocubic system in a <110> direction, wherein X in the formula described above is within the range of 0.26 to 0.29, and the specific inductive capacity at 25° C. is 5,000 or more.

(6) The piezoelectric single crystal device according to any one of the above-described items (1) to (5), the above-described piezoelectric single crystal device further containing 0.05 to 30 mole percent of lead indium niobate $[Pb(In_{1/2}Nb_{1/2})O_3]$.

(7) The piezoelectric single crystal device according to any one of the above-described items (1) to (6), wherein 0.05 to 10 mole percent of lead in the composition of the above-described piezoelectric single crystal device has been substituted with calcium.

According to various exemplary embodiments of the piezoelectric single crystal device, it is possible to provide a piezoelectric single crystal device exhibiting excellent piezoelectric properties, particularly at temperatures higher than room temperature, specifically within a specific high-temperature range of $T_{rt}°$ C. to $(T_{rt}-20)°$ C. (for example, about 50° C. to 70° C.), where $T_{rt}$ represents a transformation temperature between a pseudocubic system and a tetragonal system. Furthermore, since excellent piezoelectric properties are exhibited also at room temperature, stable piezoelectric properties can be exhibited with high sensitivity even when the piezoelectric single crystal device is used within a wide temperature range, for example, from room temperature to the above-described specific high-temperature range.

BRIEF DESCRIPTION OF THE DRAWINGS

FIG. 5 is a graph showing the relationship between the specific inductive capacity and the temperature of a single crystal device having a composition represented by $[Pb(Mg,Nb)O_3]_{(1-X)} \cdot [PbTiO_3]_{(X)}$, where X is within the range of 0.256 to 0.300, and wherein a direction of polarization is adjusted to be a [110] axis of a pseudocubic system.

Figure 1:
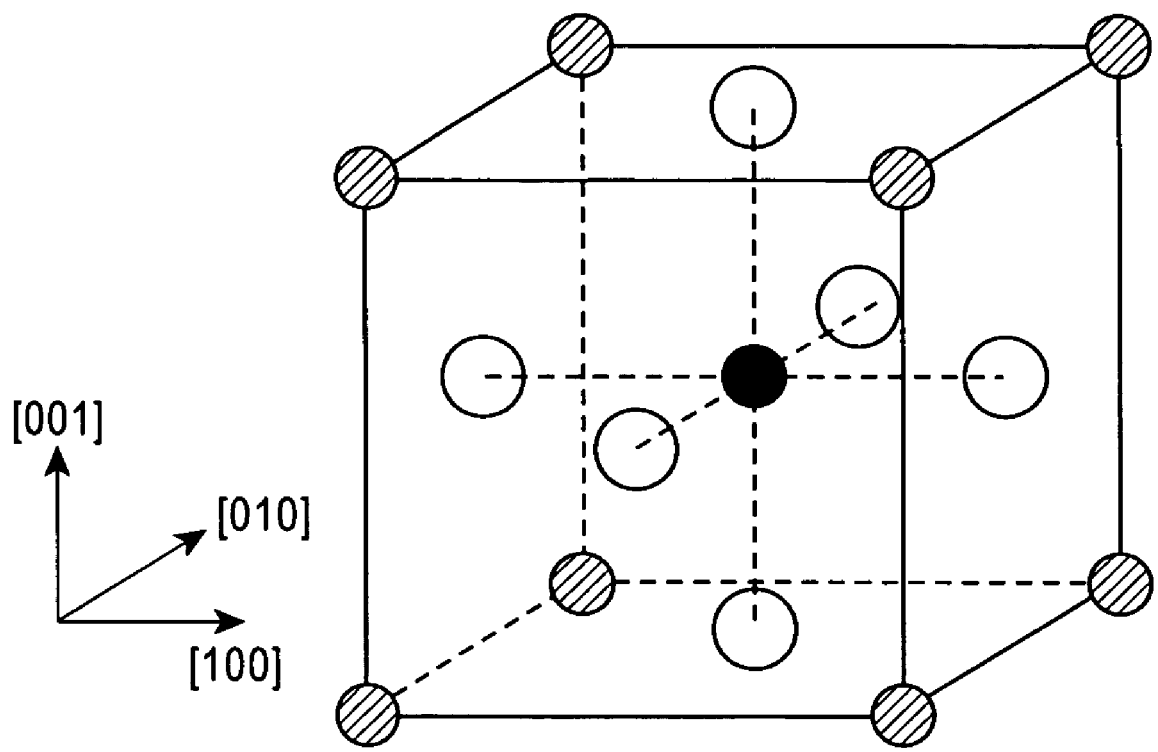
FIG. 1 is a schematic perspective view of a perovskite crystal structure ($RMO_3$).

DETAILED DESCRIPTION OF EMBODIMENTS (1) Composition and Structure of an Exemplary Piezoelectric Single Crystal Device The exemplary piezoelectric single crystal device is a solid solution made of $[Pb(Mg,Nb)O_3]_{(1-X)} \cdot [PbTiO_3]_{(X)}$, and exhibits excellent piezoelectric properties, particularly at temperatures higher than room temperature, and specifically within a specific high-temperature range of $T_{rt}°$ C. to $(T_{rt} -20)°$ C. (for example, about 50° C. to 70° C.) when a piezoelectric single crystal material satisfying the above-described formula where X is within the range of 0.26 to 0.29 and having a complex perovskite structure is used. That is, the unit cell of the solid solution single crystal must have a perovskite structure ($RMO_3$) in which Pb ions are located at corners of the unit cell, oxygen ions are located at face centers of the unit cell, and an M ion such as, for example, Mg, Nb, or Ti, is located at a body center of the unit cell, as schematically shown in FIG. 1, and the piezoelectric single crystal material must have a complex perovskite structure in which the M ion located at the body center shown in FIG. 1 is not one type of element ion but at least two types of element ion, for example, at least two of Mg, Nb, and Ti.

In particular, in the case where lead magnesium niobate-lead titanate (PMN-PT) is used as the solid solution single crystal, the chemical formula represented by $[Pb(Mg,Nb)O_3]_{(1-X)} \cdot [PbTiO_3]_{(X)}$, where the molar fraction X of lead titanate $PbTiO_3$ is within the range of 0.26 to 0.29, must be satisfied.

Figure 2:
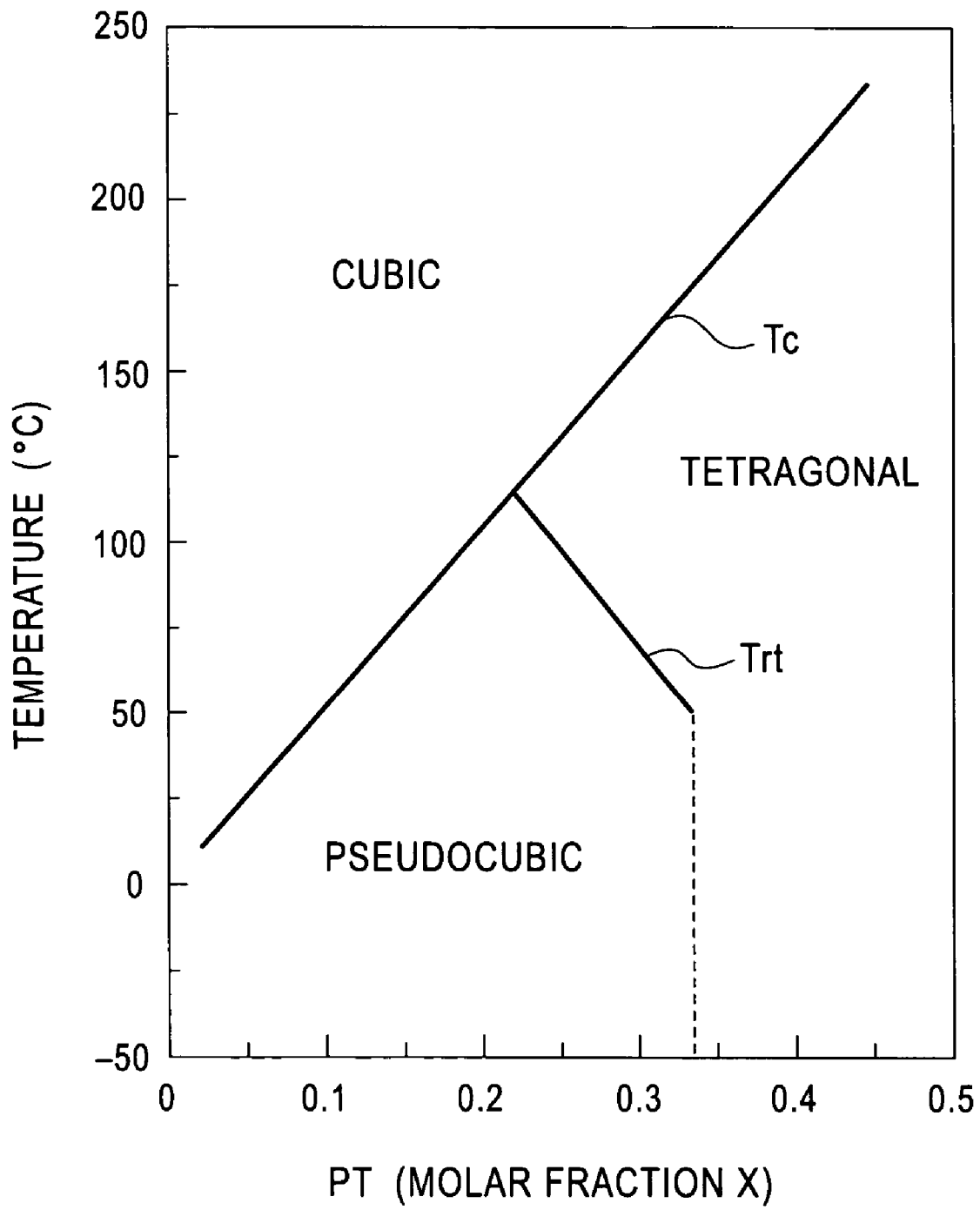
FIG. 2 is a phase diagram of PMN-PT (PMNT).

FIG. 2 shows a phase diagram of lead magnesium niobate-lead titanate (PMN-PT).

In a temperature range in which a pseudocubic system can be stably present, excellent piezoelectric properties are exhibited at temperatures higher than room temperature, specifically within a specific high-temperature range of $T_{rt}°$ C. to $(T_{rt}-20)°$ C. (for example, about 50° C. to 70° C.), where $T_{rt}$ represents a transformation temperature between a pseudocubic system and a tetragonal system, as compared with the piezoelectric properties at room temperature. A plurality of piezoelectric single crystal devices having compositional ratios suitable for the stable presence of the pseudocubic system over a temperature range higher than ambient temperature can be prepared by changing the molar fraction X of lead titanate $PbTiO_3$ within the range of 0.23 to 0.33 based on the phase diagram shown in FIG. 2, so as to examine the piezoelectric properties thereof. As a result, the specific inductive capacity is increased significantly when the molar fraction X of lead titanate $PbTiO_3$ is within a specific narrow range of 0.26 to 0.29, and excellent piezoelectric properties are exhibited.

The value of the molar fraction X of lead titanate $PbTiO_3$ is calculated based on the following previously known equation:

$$X/100=1/\{4.8591\times(Y-9.6267)\}$$

where Y represents a Curie temperature $T_c$ (° C.) of the single crystal device material.

Preferably, a molar ratio of Mg to Nb in the above-described single crystal is within the range of 0.45 to 0.55. The target value of the molar ratio of Mg to Nb is 0.50. However, the molar ratio is not always 0.50, and in many cases, the molar ratio deviates from 0.50 because of a material loss during production. Therefore, the molar ratio of Mg to Nb is specified to be within the range of 0.45 to 0.55. If the above-described ratio is out of the above-described range, the complex perovskite structure cannot be formed, and a crystal structure such as, for example, a pyrochlore structure, exhibiting significantly poor piezoelectric properties and unsuitable for the present invention tends to result.

The following materials may be included in the above-described composition:

(a) Lead Indium Niobate $[Pb(In_{1/2}Nb_{1/2})O_3]$: 0.05 Mole Percent to 30 Mole Percent The ion radius of indium (In) in lead indium niobate is larger than the ion radii of magnesium (Mg) and zinc (Zn) but smaller than the ion radius of niobium (Nb). Therefore, the lattice strain resulting from a difference between the ion radius of niobium (Nb) located at the body center position of the perovskite structure and the ion radius of magnesium (Mg) or zinc (Zn) is relaxed, and effects of interfering occurrence of cracking during growth of a single crystal and occurrence of chipping during piezoelectric device processing are exerted. In various exemplary embodiments, 0.05 mole percent or more of lead indium niobate must be added in order to exert the above-described effects. However, addition of more than 30 mole percent of lead indium niobate is not preferable because the melting point of the raw material for growing a single crystal is increased and, as a consequence, the process control in the production becomes difficult.

According to various exemplary embodiments, the molar ratio, In/Nb, of In to Nb in lead indium niobate $Pb(In_{1/2}Nb_{1/2})O_3$ is 1. However, the molar ratio is not limited to this value, and various exemplary embodiments include a i/Nb molar ratio within the range of 0.95 to 1.04. Therefore, lead indium niobate may be represented by $Pb(In,Nb)O_3$.

(b) Calcium Substituted for 0.05 to 10 Mole Percent of Lead in a Crystal Cell.

The method for adding calcium is not specifically limited. For example, calcium-substituted lead magnesium niobate, calcium-substituted lead zinc niobate, or calcium-substituted lead titanium niobate may be used. Alternatively, a method in which calcium oxide or calcium carbonate is added to a raw material may be used. In the case where calcium oxide is added in the raw material, calcium (Ca) atoms in calcium oxide are allowed to substitute to lead (Pb) sites (R ions in FIG. 1) of a crystal cell composed of a solid solution of three types of lead-based perovskite structure compound (lead magnesium niobate or lead zinc niobate, lead titanate, and lead indium niobate) as a substitutional atom, so as to have the effect of preventing vaporization of lead oxide at high temperatures. The generation of a pyrochlore phase can be prevented by the substitution of Ca, and as a result, a desired single crystal of complex perovskite phase is easily generated. According to various exemplary embodiments, calcium must be substituted to 0.05 mole percent or more of lead in order to have the above-described effect. However, if the substitution exceeds 10 mole percent, the growth of a single crystal becomes difficult. Consequently, it is preferable that 0.05 mole percent to 10 mole percent of lead in a crystal cell is substituted with calcium. More preferably, 0.05 mole percent to 5 mole percent of lead in a crystal cell is substituted with calcium.

(c) At Least One Element Selected from Mn, Cr, Sb, W, Al, La, Li, and Ta at 5 Mole Percent or Less in Total.

For example, in the case where the specific inductive capacity $\epsilon_r$ and the mechanical quality factor Qm must be increased, 5 mole percent or less in total of at least one element selected from Mn, Cr, Sb, W, Al, La, Li, and Ta may be further added. If the addition exceeds 5 mole percent in total, it is difficult to produce a single crystal, and a polycrystal may result.

The addition of these elements have the effects described below. For example, by the addition of Mn or Cr, the mechanical quality factor Qm can be improved and deterioration over time can be reduced. Preferably, 0.05 mole percent or more in total of at least one selected from Mn and Cr is added in order to have this effect. The specific inductive capacity is increased by addition of Sb, La, W, or Ta. Preferably, 0.05 mole percent or more in total of at least one element selected from Sb, La, W, and Ta is added in order to have this effect. Furthermore, Al or Li contributes to stabilization during growth of a single crystal. Preferably, 0.05 mole percent or more in total of at least one of Al and Li is added in order to have this effect.

(d) Other Impurities

Impurities such as, for example, Fe, Pt, Au, Pd, and Rh, may be mixed from raw materials, a crucible, and the like during a production process of a piezoelectric single crystal. Since these impurities interfere with the generation of a single crystal, it is desirable that these are controlled at 0.5 mole percent or less in total.

The piezoelectric single crystal device according to various exemplary embodiments exhibits excellent piezoelectric properties within the specific high-temperature range described above regardless of a polarization direction PD. That is, the specific inductive capacity at 25° C. is 5,000 or more, and the specific inductive capacity at a transformation temperature between a pseudocubic system and a tetragonal system of the above-described single crystal is 2.5 times or more larger than the specific inductive capacity at 25° C. In particular, the case where the molar fraction X of lead titanate $PbTiO_3$ is within the range of 0.27 to 0.29 and the polarization direction PD is specified to be a <100> direction may be preferable since excellent piezoelectric properties are exhibited stably, wherein the specific inductive capacity at 25° C. is 6,500 or more, and the specific inductive capacity at the transformation temperature between a pseudocubic system and a tetragonal system of the above-described single crystal is 2.5 times or more larger than the specific inductive capacity at 25° C.

In addition, in the case where the polarization direction PD is specified to be the <100> direction, the specific inductive capacity at the transformation temperature $T_{rt}$ between a pseudocubic system and a tetragonal system of the above-described single crystal is significantly increased to 20,000 or more. Therefore, this may be preferable when the piezoelectric single crystal device is used within the specific high-temperature range described above since very highly sensitive piezoelectric properties are exhibited.

Furthermore, in the case where the polarization direction PD is specified to be a <110> direction as well, the specific inductive capacity at the transformation temperature $T_{rt}$ between a pseudocubic system and a tetragonal system of the above-described single crystal is significantly increased to 20,000 or more. Therefore, this may be preferable when the piezoelectric single crystal device is used within the specific high-temperature range described above since very highly sensitive piezoelectric properties are exhibited.

(2) Shape of Single Crystal Device

The shapes of "the piezoelectric single crystal device," according to various exemplary embodiments, are classified into the following two types:

(a) The case where electromechanical coupling coefficient $k_{33}$ in a direction parallel to the polarization direction PD (longitudinal direction vibration mode) is used.

Figure 6A:
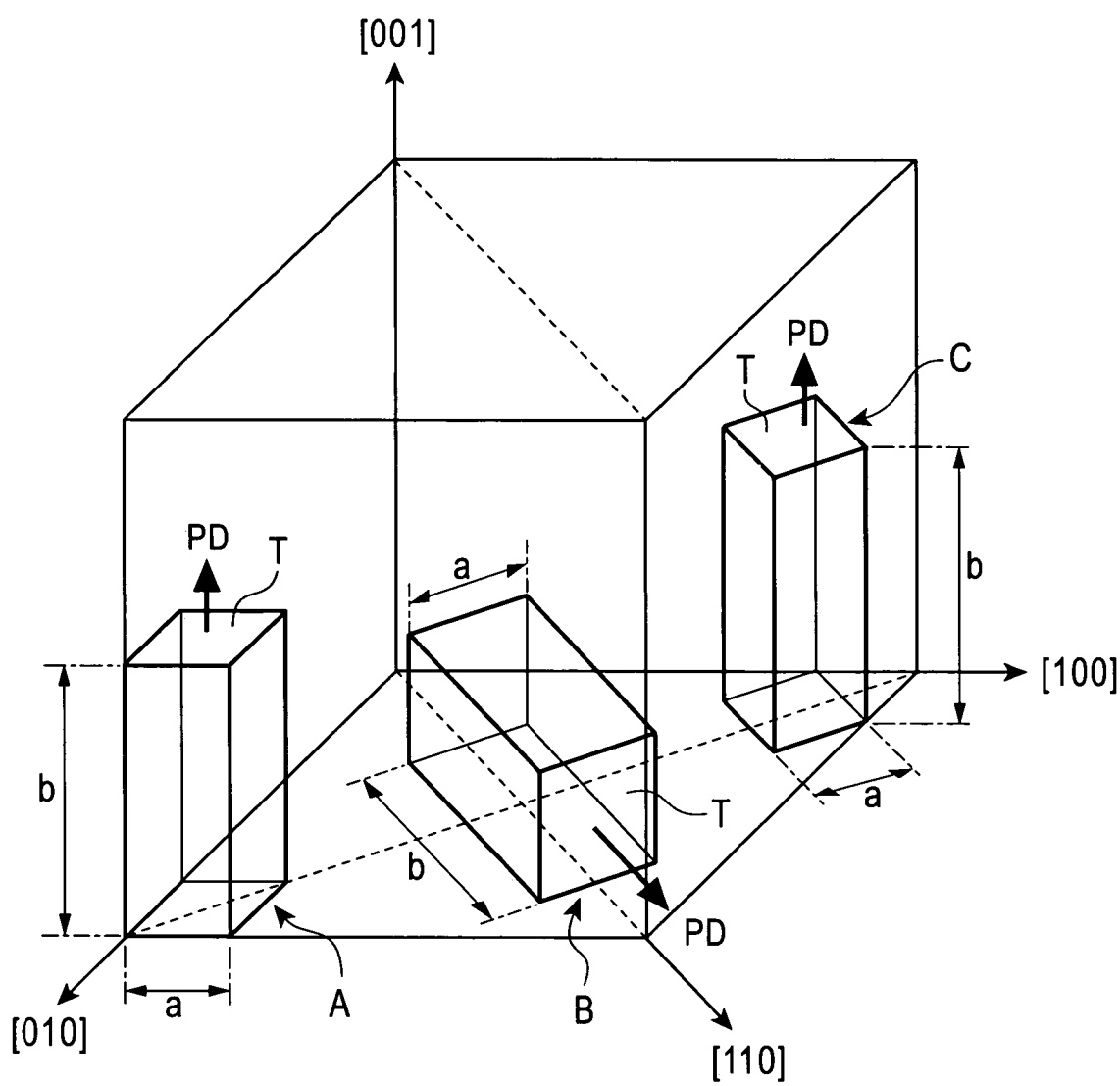
FIG. 6A and FIG. 6B are diagrams showing the shapes of exemplary piezoelectric single crystal devices A, B, C, D, E, and F, and a positional relationship therebetween.

In this case, the polarization direction PD is specified to be a [001] direction of an ingot of a piezoelectric single crystal and a piezoelectric single crystal device taking advantage of an electromechanical coupling coefficient (k33) of a vibration mode in a direction parallel to PD, that is, a longitudinal direction vibration mode wherein an end face T is a (001) face, is prepared, a rectangular parallelepiped indicated by A and C shown in FIG. 6A, a rod, or a plate, is desirable because the effect is exhibited to a full extent. In particular, in an exemplary shape of the device, when a length of a minimum side, or a diameter of a device end face T orthogonal to a polarization direction, is assumed to be "a", and a device length in a direction parallel to the polarization direction PD is assumed to be "b", it may be preferable that a and b satisfy the formula b/a≧2.0, preferably b/a≧2.5, and more preferably b/a≧3.0. If b/a is less than 2.0, the device length b becomes close to other lengths (a or c), and the natural frequencies become close to each other, so that it may become difficult to effectively eliminate only the vibration in a longitudinal direction.

Alternatively, in the case where the above-described piezoelectric single crystal is used, the polarization direction PD is specified to be a [110] direction of an ingot thereof, and a piezoelectric single crystal device, indicated by B in FIG. 6A, taking advantage of an electromechanical coupling coefficient ($k_{33}$) of a vibration mode in a direction parallel to PD, that is, a longitudinal direction vibration mode wherein an end face T is a (110) face, is prepared, it is preferable that a and b satisfy a relational formula b/a≧2.0, preferably b/a≧2.5, and more preferably b/a≧3.0 for the same reasons as discussed above.

(b) The case where the electromechanical coupling coefficient $k_{31}$ in a direction orthogonal to the polarization direction PD (transverse direction vibration mode) is used.

Figure 6B:
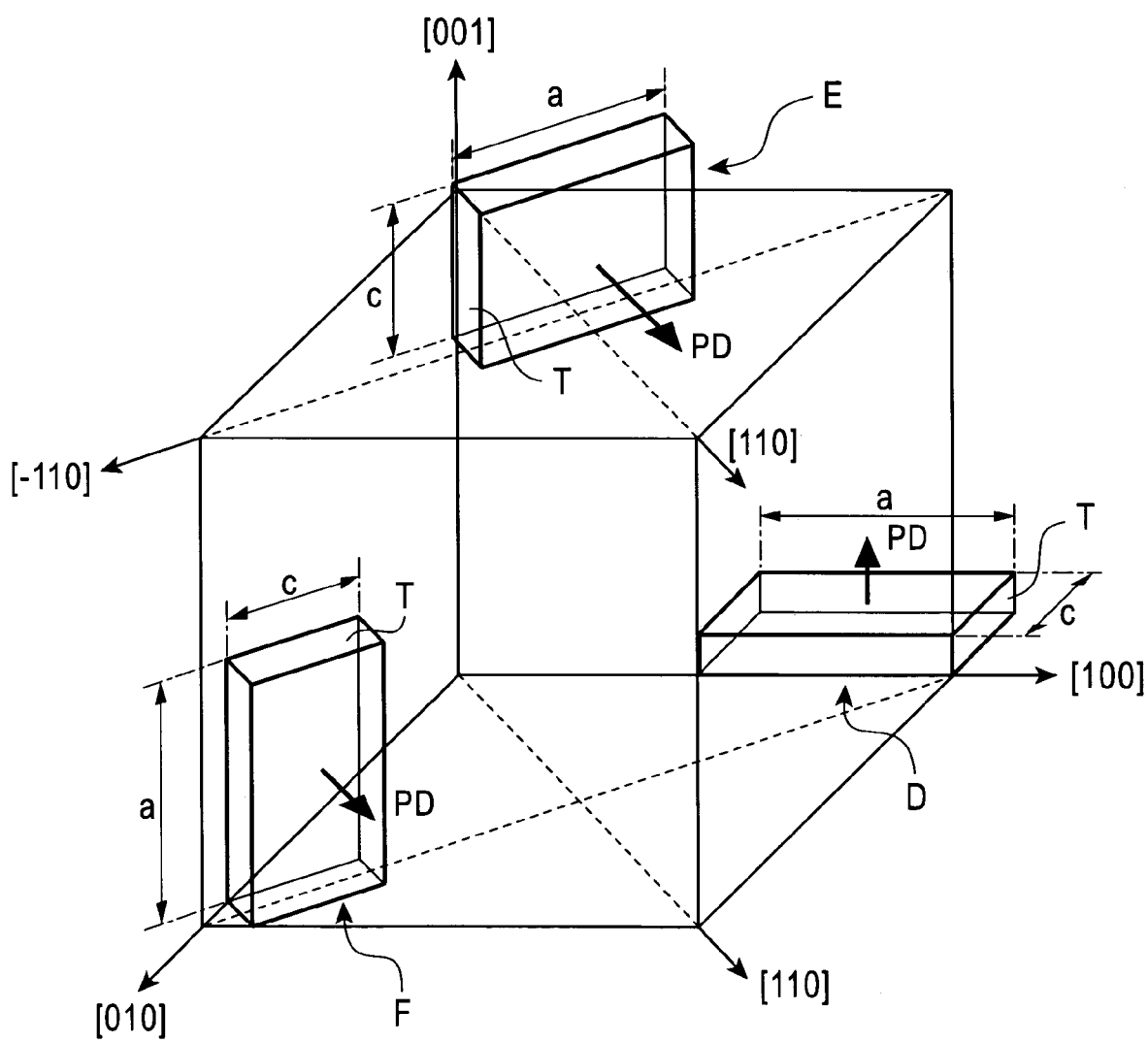

In this case, where the polarization direction PD is specified to be a [001] direction, and a piezoelectric single crystal device taking advantage of an electromechanical coupling coefficient ($k_{31}$) of a vibration mode in a [100] direction substantially perpendicular to PD, that is, a transverse direction vibration mode wherein an end face T is a (100) face, is prepared, a plate indicated by D in FIG. 6B may be desirable because the effect is exhibited to a full extent. In particular, a desirable shape of the device is a plate having an aspect ratio (a/c) of 2.0 or more, and preferably of 2.5 or more. A plate having an aspect ratio (a/c) of 3 or more may also be desirable.

Alternatively, in the case where a piezoelectric single crystal in the above-described shape of a plate indicated by E and F in FIG. 6B is used, the polarization direction PD is specified to be a [110] direction of an ingot thereof, and a crystal device taking advantage of an electromechanical coupling coefficient ($k_{31}$) of a vibration mode in a direction substantially perpendicular to PD, that is, a transverse direction vibration mode wherein an end face T is a (−110) face or (001) face, is prepared, a desirable shape of the device may be a plate having an aspect ratio (a/c) of 2.0 or more, and preferably of 2.5 or more. A plate having an aspect ratio (a/c) of 3 or more may also be desirable. The reason is similar to the reasons discussed above.

A suitable method for producing the piezoelectric single crystal device according to various exemplary embodiments is described below:

The method for producing a piezoelectric single crystal device includes a step of producing an ingot of a single crystal, a step of cutting a predetermined shape of single crystal device material from the ingot of the single crystal in a predetermined direction, a main polarization step of polarizing the single crystal device material by applying an electric field in a [001] direction or a [110] direction of this single crystal device material under a predetermined condition (FIG. 3), and furthermore, if necessary, an auxiliary polarization step of conducting polarization before or after the main polarization step. Each step is further described below.

(1) Production of Single Crystal Ingot

Methods for producing an ingot of a single crystal which is a solid solution composed of $[Pb(Mg,Nb)O_3]_{(1-X)} \cdot [PbTiO_3]_{(X)}$, where X is a molar fraction of $PbTiO_3$ and which satisfy the above-described formula where X is within the range of 0.26 to 0.29, include a method in which a raw material adjusted to have the above-described composition is dissolved into a flux and, thereafter, the temperature is lowered to effect solidification and a method in which the raw material is melted by being heated to higher than or equal to a melting point and, thereafter, solidification in one direction is effected so that a single crystal is produced. Examples of the former methods include a solution Bridgman method and a top seeded solution growth (TSSG) method, and examples of the latter methods include a melt Bridgman method and a Czochralski (CZ) method. The method is not specifically limited in the present invention.

The value of the molar fraction X of lead titanate $PbTiO_3$ according to various exemplary embodiments is calculated based on the following previously known equation:

$$X/100 = 1/\{4.8591 \times (Y - 9.6267)\}$$

where Y represents a Curie temperature $T_c$ (° C.) of the single crystal device material.

(2) Determination of Crystallographic Orientation of Piezoelectric Single Crystal Ingot According to various exemplary embodiments, a method for determining a crystallographic orientation of the piezoelectric single crystal ingot is not specifically limited. For example, when the polarization direction PD is specified to be a [001] direction of the single crystal ingot, the [001] axis orientation of the single crystal ingot is roughly determined by a Laue method, and at the same time, a [010] axis orientation and a [100] axis orientation substantially orthogonal to the [001] axis orientation and, if necessary, crystallographic orientations, such as, for example, [110], [101], and [011] axis orientations, are roughly determined.

A crystallographic face, {100} face, orthogonal to any one of crystal axes such as, for example, the [001] axis, the [010] axis, and the [100] axis, is polished, and an accurate orientation is determined by using an X-ray direction finder or the like, so as to correct the deviation of the polished face.

Furthermore, when the polarization direction PD is specified to be the [110] direction of the single crystal ingot, the orientation is determined in a manner similar to the above-described method.

(3) Rough Cutting (Production of Wafer Having an Appropriate Thickness)

The single crystal ingot is cut parallel to or orthogonal to the polished face, a {100} face or a {110} face, of the above-described single crystal ingot by using a cutting machine such as, for example, a wire saw or an inner diamond saw, so that a tabular material (wafer) having an appropriate thickness is produced. If necessary, a step of conducting chemical etching by using an etching solution may also be included after the cutting.

(4) Polishing (Production of Wafer Having a Predetermined Thickness)

The above-described wafer is polished or ground with a lapping machine, a polishing machine, a grinding machine, or the like, so that a wafer having a predetermined thickness is produced. If necessary, a step of conducting chemical etching by using an etching solution may also be included after the polishing or grinding is performed.

(5) Production of the Single Crystal Device Material

A wafer face (the widest face) of the above-described wafer includes a (001) face or a (110) face. A predetermined shape of a single crystal device material is produced by being cut from the wafer by using a precise cutter such as, for example, a dicing saw and a cutting saw, in such a way that the direction of the normal to the device end face T agrees with a <100> axis or a <110> axis.

The methods in the above-described items (3) to (5) relate to methods for processing a plate. However, a method for processing a rod is basically the same as the method for processing the plate.

(6) Production of Electrodes

Electrodes required for applying an electric field in the main polarization treatment or the auxiliary polarization treatment must be prepared in advance.

Figure 3:
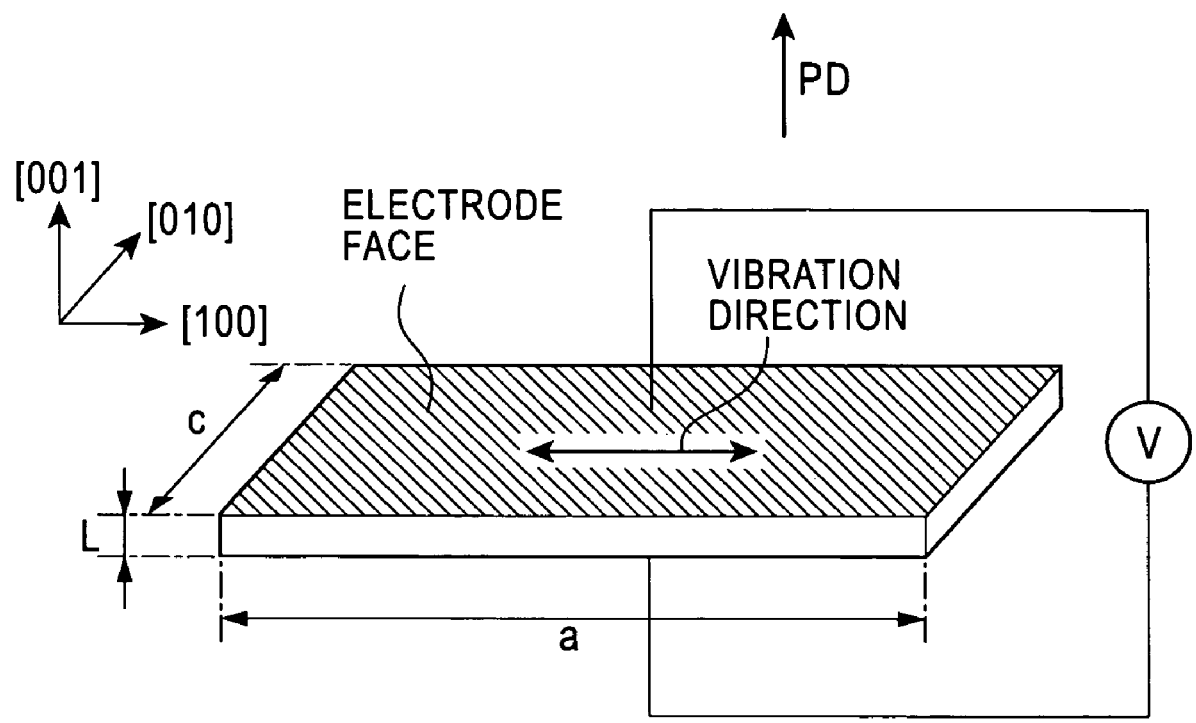
FIG. 3 is a perspective view showing the orientation and the shape of an exemplary piezoelectric single crystal device in a polarized state.

Before the main polarization treatment is conducted, as shown in, for example, FIG. 3, Cr—Au coatings (the first layer is a Cr layer: thickness about 50 nm, and the second layer is a Au layer: thickness about 100 to 200 nm) are formed by a sputtering method, gold coatings are formed by a plasma evaporation method, or silver coatings are formed by a screen printing method on the top and bottom faces (the direction of the normal to the top and bottom faces is the polarization direction PD), which are a (001) face and a (00-1) face opposite to each other, of the single crystal device material produced, and thereafter firing is conducted so as to produce electrodes.

Before the auxiliary polarization treatment is conducted, electrodes are formed on two opposite faces perpendicular to the auxiliary polarization direction, in a manner similar to the above-described method.

In the case where the main polarization treatment is conducted after the auxiliary polarization treatment is conducted, or the auxiliary polarization treatment is conducted after the main polarization treatment is conducted, if the electrode used in the initial polarization treatment is left, the following polarization treatment becomes unstable. Therefore, the electrode must be removed completely with an appropriate chemical etching solution or acid.

(7) Main Polarization Treatment Step

A single crystal, which is in a state of being cut from the single crystal ingot after the growing is completed, does not exhibit piezoelectric properties in the polarization direction and a direction orthogonal thereto, and the single crystal is not polarized since directions of electric dipoles in different domains are random on a domain basis, each domain composed of an assembly of electric dipoles oriented in the same direction.

An application of a direct current electric field of 350 to 1,500 V/mm at a temperature in the range of 20° C. to 200° C. in the polarization direction PD of the cut single crystal device material is suitable for the main polarization step of the present invention. That is, in the case where the temperature is less than 20° C., which is the lower limit of the above-described suitable temperature range, or the electric field is less than 350 V/mm, which is the lower limit of the applied electric field range, the polarization is unsatisfactory. In the case where the temperature exceeds 200° C., which is the upper limit of the above-described suitable temperature range, or the electric field exceeds 1,500 V/mm, which is the upper limit of the applied electric field range, over-poling occurs and, thereby, the piezoelectric properties of the piezoelectric single crystal device are deteriorated. Furthermore, the strain in the crystal may be increased, cracking may occur in the piezoelectric single crystal device, and fracture may occur due to an excessive electric field.

The polarization time is adjusted in accordance with the polarization treatment temperature, and the applied electric field selected within the above-described suitable ranges, and preferably, the upper limit thereof, is specified to be about 180 minutes.

Alternatively, in the main polarization step, a direct current electric field of 250 to 500 V/mm is applied at a temperature higher than a Curie temperature $T_c$ of the single crystal device material, preferably within the temperature range of 170° C. to 200° C. in the polarization direction PD of the cut single crystal device material, and cooling (electric field cooling) to room temperature may be conducted while the application of the direct current electric field is kept. When the electric dipole is allowed to disappear by raising the temperature to the level higher than the Curie temperature $T_c$ and, thereafter, cooling to the Curie temperature or lower is conducted, the directions of electric dipoles are more neatly aligned. If the temperature is kept lower than or equal to the Curie temperature, the electric dipoles remain partly and, thereby, the polarization becomes unsatisfactory. If the electric field is less than 250 V/mm, which is the lower limit of the suitable range of the applied electric field, the polarization becomes unsatisfactory. In the case where the electric field exceeds 500 V/mm, which is the upper limit of the suitable range of the applied electric field, over-poling occurs, the piezoelectric properties of the piezoelectric single crystal device are deteriorated. Furthermore, the strain in the crystal may be increased, cracking may occur in the piezoelectric single crystal device, and fracture may occur due to an excessive electric field. It is desirable that the cooling rate is such a cooling rate that cause no cracking in the device during cooling.

The Curie temperature $T_c$ is a transition temperature. If a temperature becomes higher than or equal to $T_c$, electric dipoles are randomly directed and not aligned, so that the piezoelectric property or ferroelectricity is not exhibited. The Curie temperature is specifically determined based on the composition and structure of the substance.

According to various exemplary embodiments, the piezoelectric single crystal device exhibits excellent piezoelectric properties within the above-described specific high-temperature range regardless of the polarization direction PD. However, it is preferable that the polarization direction is particularly specified to be the <100> direction or the <110> direction since the specific inductive capacities at 25° C. are 6,500 or more and 5,000 or more, respectively, a specific inductive capacity at the transformation temperature between a pseudocubic system and a tetragonal system of the above-described single crystal is 2.5 times or more larger than the specific inductive capacity at 25° C. and, therefore, excellent piezoelectric properties are exhibited stably.

In addition, in the case where the polarization direction PD is specified to be the <100> direction or the <110> direction, the specific inductive capacity at the transformation temperature $T_{rt}$ between a pseudocubic system and a tetragonal system of the above-described single crystal is significantly increased to 20,000 or more. Therefore, this is preferable when the piezoelectric single crystal device is used within the above-described specific high-temperature range since very highly sensitive piezoelectric properties are exhibited.

(8) Auxiliary Polarization Step

The above-described main polarization step is a step to conduct the main polarization of the piezoelectric single crystal device. According to various exemplary embodiments, another production method is also effective, in which the alignment state of ferroelectric domains in a direction orthogonal to the above-described polarization direction PD is controlled by the application of an electric field in the direction orthogonal to the above-described polarization direction PD, before or after the main polarization step is conducted.

Examples of types of electric field applied in the direction orthogonal to the above-described polarization direction PD include a direct current electric field, a pulse electric field, an alternating current electric field, steady states thereof, and an attenuation electric field. There are appropriate conditions of strength and application time of the electric field, temperature, and the like in accordance with desired piezoelectric properties. These can be determined based on experiments and the like. Preferably, the auxiliary polarization step temperature is 25° C. or more a phase transition temperature (for example, a line Trt shown in FIG. 2) or less, and the applied electric field is within the range of 350 to 1,500 V/mm in order to have the effect of the auxiliary polarization. Preferably, the polarization time is adjusted in accordance with the polarization treatment temperature and the applied electric field selected within the above-described suitable ranges. In particular, a desirable range is 10 minutes to 2 hours.

The unipolar pulse and the bipolar pulse, such as, for example, an alternating triangular wave, in addition to a rectangular wave, can be used as the above-described pulse electric field.

The above description shows only an example of the embodiments of the present invention. Various modifications can be made within the scope of the appended claims.

First Embodiment

Piezoelectric single crystal devices (device shape: 13 mm long×4 mm wide×0.36 mm thick) are prepared from piezoelectric single crystal materials composed of lead magnesium niobate (PMN) (a molar ratio of Mg to Nb was 0.5) and lead titanate (PT) (PMN-PT) having compositions in which the molar fraction X of lead titanate $PbTiO_3$ may be one of 0.267, 0.270, 0.278, 0.283, 0.290, and 0.300.

The production of the piezoelectric single crystal device is in accordance with the above-described production method. The raw material is adjusted to have a composition represented by $[Pb(Mg,Nb)O_3]_{(1-X)} \cdot [PbTiO_3]_{(X)}$, where X is within the range of 0.267 to 0.300. A single crystal ingot is produced by the above-described melt Bridgman method. An accurate crystallographic orientation of the resulting single crystal ingot is determined. After polishing is conducted, the single crystal ingot is cut with a wire saw orthogonally to the polished face, the (001) face, so that a tabular material having a thickness of 0.5 mm is produced. The resulting tabular material is polished with a polishing machine, so that a wafer having a thickness of 0.36 mm is produced. A piezoelectric single crystal material having a device shape of 13 mm long×4 mm wide×0.36 mm thick is prepared by being cut from the resulting wafer with a dicing saw.

Figure 4:
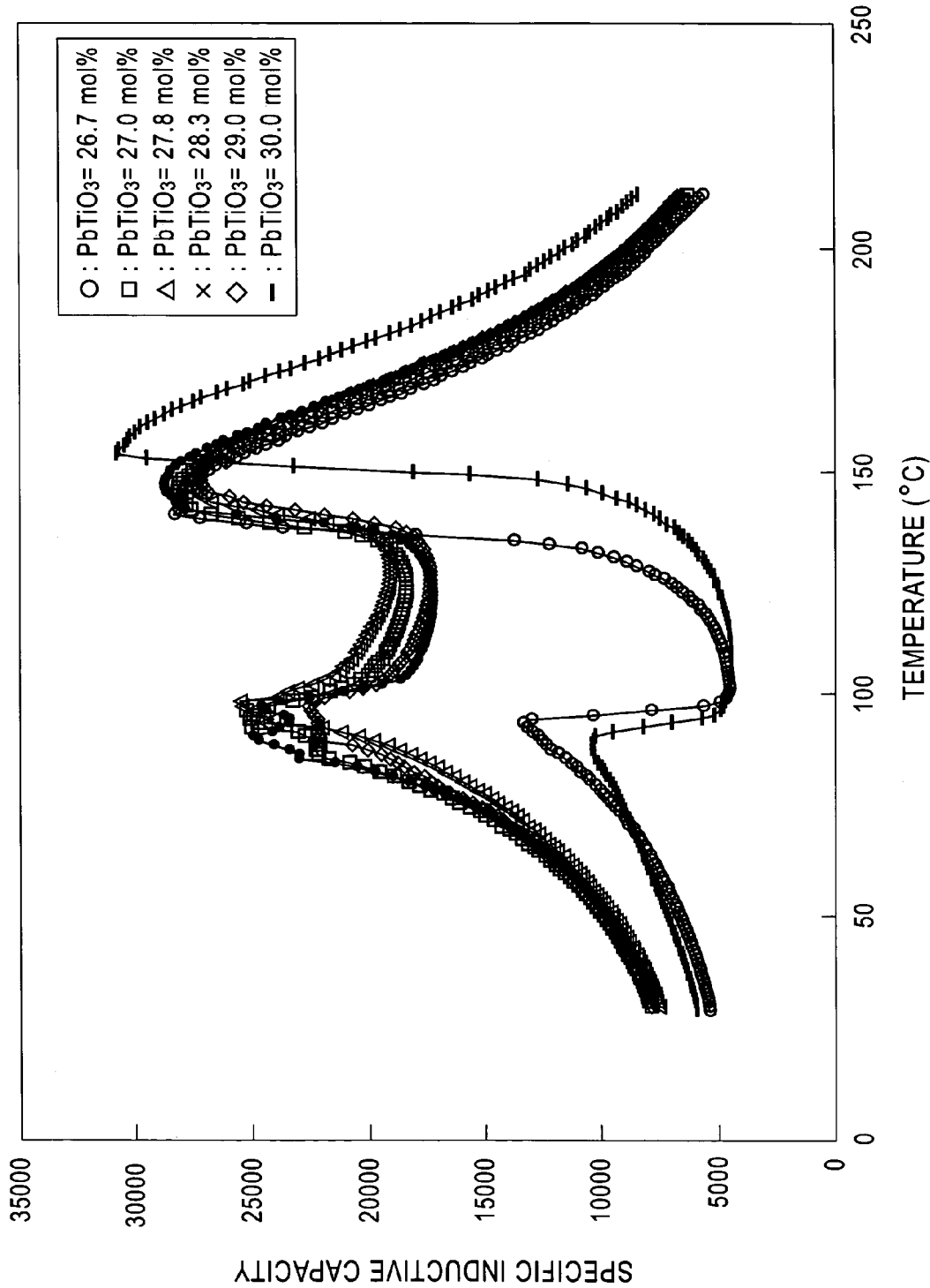
FIG. 4 is a graph showing the relationship between the specific inductive capacity and the temperature for an exemplary single crystal device having a composition represented by $[Pb(Mg,Nb)O_3]_{(1-X)} \cdot [PbTiO_3]_{(X)}$, where X is within the range of 0.267 to 0.300, and wherein a direction of polarization is adjusted to be a [001] axis of a pseudocubic system.

After the piezoelectric single crystal material is prepared, polarization is conducted by using a polarization method in which a direct current electric field of 700 V/mm is applied in the air at 25° C. for 60 minutes, so that a piezoelectric single crystal device is produced. Subsequently, the piezoelectric properties of each piezoelectric single crystal device is measured at temperatures within the range of room temperature (25° C.) to 220° C., and the specific inductive capacities are calculated. FIG. 4 is a graph in which the relationship between the resulting specific inductive capacity and the temperature is plotted. The specific inductive capacity $\epsilon_r^{25}$ at 25° C., the specific inductive capacity $\epsilon_r^{Trt}$ at a transformation temperature $T_{rt}$, and a ratio of these specific inductive capacities $\epsilon_r^{Trt}/\epsilon_r^{25}$ are shown in Table 1. The specific inductive capacity is measured with an impedance analyzer (Model 4192A) produced by Yokogawa-Hewlett-Packard, Ltd. The value of the molar fraction X of lead titanate $PbTiO_3$ is calculated based on the following previously known equation:

$$X/100=1/\{4.8591\times(Y-9.6267)\}$$

where Y represents a Curie temperature $T_c$ (° C.) of the single crystal device material.

In advance of the above-described polarization, Cr—Au coatings (the first layer is a Cr layer: thickness about 50 nm, and the second layer is a Au layer: thickness about 100 to 200 nm) are formed by, for example, a sputtering method on the top and bottom faces, which are a (001) face and a (00-1) face opposite to each other, of the single crystal device material produced, so as to produce gold electrodes.

As is clear from the results shown in Table 1, each one of Sample Nos. 2 to 5, which are examples of the present invention exhibits a specific inductive capacity $\epsilon_r^{25}$ at 25° C. of 7,599 or more, which is more than 6,500, a specific inductive capacity $\epsilon_r^{Trt}$ at the above-described transformation temperature $T_{rt}$ of 22,520 or more, which is more than 20,000, and a ratio of these specific inductive capacities $\epsilon_r^{Trt}/\epsilon_r^{25}$ of 2.88 or more, which is more than 2.5. Therefore, a high sensitivity is exhibited at room temperature as well as in a specific high-temperature range ($T_{rt}$° C. to ($T_{rt}$−20)° C.).

On the other hand, each one of Sample Nos. 1 and 6, which are comparative examples, exhibits a specific inductive capacity $\epsilon_r^{25}$ at 25° C. of 5,931 or less, which is less than 6,500, a specific inductive capacity $\epsilon_r^{Trt}$ at the above-described transformation temperature $T_{rt}$ of 13,335 or less, which is less than 14,000, and a ratio of these specific inductive capacities $\epsilon_r^{Trt}/\epsilon_r^{25}$ of 2.47 or less, which is less than 2.50. Therefore, poor piezoelectric properties are exhibited in the comparative examples at room temperature as well as in a specific high-temperature range ($T_{rt}$° C. to ($T_{rt}$−20)° C.).

Second Embodiment

Piezoelectric single crystal devices (device shape: 13 mm long×4 mm wide×0.36 mm thick) are prepared from piezoelectric single crystal materials composed of lead magnesium niobate (PMN) (a molar ratio of Mg to Nb was 0.5) and lead titanate (PT) (PMN-PT) having compositions in which the molar fraction X of lead titanate $PbTiO_3$ may be one of 0.253, 0.256, 0.268, 0.279, 0.290, and 0.300.

The production of the piezoelectric single crystal device is performed in accordance with the production method in the above-described first embodiment. The raw material is adjusted to have a composition represented by $[Pb(Mg,Nb)O_3]_{(1-X)}\cdot[PbTiO_3]_{(X)}$, where X is within the range of 0.253 to 0.300. A single crystal ingot is produced by the above-described melt Bridgman method. An accurate crystallographic orientation of the resulting single crystal ingot is determined. After polishing is conducted, the single crystal ingot is cut with a wire saw orthogonally to the polished face, the (110) face, so that a tabular material having a thickness of 0.5 mm is produced. The resulting tabular material is polished with a polishing machine, so that a wafer having a thickness of 0.36 mm is produced. A piezoelectric single crystal material having a device shape of 13 mm long×4 mm wide×0.36 mm thick is prepared by being cut from the resulting wafer with a dicing saw.

After the piezoelectric single crystal material is prepared, polarization is conducted by using a polarization method in which a direct current electric field of 700 V/mm is applied in the air at 25° C. for 60 minutes, so that a piezoelectric single crystal device is produced. Subsequently, the piezoelectric properties of each piezoelectric single crystal device is measured at temperatures within the range of room temperature (25° C.) to 220° C., and the specific inductive capacities are calculated. FIG. 5 is a graph in which the relationship between the resulting specific inductive capacity and the temperature is plotted. The specific inductive capacity $\epsilon_r^{25}$ at 25° C., the specific inductive capacity $\epsilon_r^{Trt}$ at a transformation temperature $T_{rt}$, and a ratio of these specific inductive capacities $\epsilon_r^{Trt}/\epsilon_r^{25}$ are shown in Table 2. The specific inductive capacity is measured with the impedance analyzer (Model 4192A) produced by Yokogawa-Hewlett-Packard, Ltd. The value of the molar fraction X of lead titanate $PbTiO_3$ is calculated based on the following previously known equation:

$$X/100=1/\{4.8591\times(Y-9.6267)\}$$

where Y represents a Curie temperature $T_c$ (° C.) of the single crystal device material.

In advance of the above-described polarization, Cr—Au coatings (the first layer is a Cr layer: thickness about 50 nm, and the second layer is a Au layer thickness about 100 to 200 nm) are formed by, for example, a sputtering method on the top and bottom faces, which are a (110) face and a (-1-10) face opposite to each other, of the single crystal device material produced, so as to produce electrodes.

As is clear from the results shown in Table 2, each one of Sample Nos. 2 to 5, which are examples of the present invention, exhibits a specific inductive capacity $\epsilon_r^{25}$ at 25° C. of 5,973 or more, which is more than 5,000, a specific inductive capacity $\epsilon_r^{Trt}$ at the above-described transformation temperature $T_{rt}$ of 33,074 or more, which is more than 20,000, and a ratio of these specific inductive capacities $\epsilon_r^{Trt}/\epsilon_r^{25}$ of 4.60 or more, which is more than 2.5. Therefore, highly sensitive piezoelectric properties are exhibited at room temperature as well as in a specific high-temperature range ($T_{rt}$° C. to ($T_{rt}$−20)° C.).

On the other hand, each one of Sample Nos. 1 and 6, which are comparative examples, exhibits a specific inductive capacity $\epsilon_r^{25}$ at 25° C. of 4,860 or less, which is less than 5,000, a specific inductive capacity $\epsilon_r^{Trt}$ at the above-described transformation temperature $T_{rt}$ of 11,216 or less, which is less than 20,000, and a ratio of these specific inductive capacities $\epsilon_r^{Trt}/\epsilon_r^{25}$ of 2.40 or less, which is less than 2.50. Therefore, poor piezoelectric properties are exhibited at room temperature as well as in a specific high-temperature range ($T_{rt}$° C. to ($T_{rt}$−20)° C.).

The above description shows only examples of the embodiments of the present invention. Various modifications can be made within the scope of the appended claims.

Third Embodiment

In each of the above-described first and second embodiments, a crystal having the composition represented by [Pb(Mg,Nb)O$_3$]$_{(1-X)}$·[PbTiO$_3$]$_{(X)}$, where X is within the range of 0.26 to 0.29 is described. In addition, devices may be produced from crystals in which the amounts of addition of lead indium niobate and/or calcium (Ca) are variously changed by a production method similar to those in the first and second embodiments. Subsequently, the specific inductive capacity $\epsilon_r^{25}$ at 25° C., the specific inductive capacity $\epsilon_r^{Trt}$ at a transformation temperature $T_{rt}$, and a ratio of these specific inductive capacities $\epsilon_r^{Trt}/\epsilon_r^{25}$ were measured. The results thereof are shown in Table 3 and Table 4.

As shown in Table 3, in each of the cases where the polarization direction PD is a [001] axis of a pseudocubic system, the specific inductive capacity $\epsilon_r^{25}$ at 25° C. is 7,329 or more, which is more than 6,500, the specific inductive capacity $\epsilon_r^{Trt}$ at the above-described transformation temperature $T_{rt}$ is 24,108 or more, which is more than 20,000, and the ratio of these specific inductive capacities $\epsilon_r^{Trt}/\epsilon_r^{25}$ is 3.16 or more, which is more than 2.5. Therefore, highly sensitive piezoelectric properties are exhibited at room temperature as well as in a specific high-temperature range ($T_{rt}$° C. to ($T_{rt}$−20)° C.).

Furthermore, as shown in Table 4, in each of the cases where the polarization direction PD is a [110] axis of the pseudocubic system, the specific inductive capacity $\epsilon_r^{25}$ at 25° C. is 6,873 or more, which is more than 5,000, the specific inductive capacity $\epsilon_r^{Trt}$ at the above-described transformation temperature $T_{rt}$ is 30,189 or more, which is more than 20,000, and the ratio of these specific inductive capacities $\epsilon_r^{Trt}/\epsilon_r^{25}$ is 4.36 or more, which is more than 2.5. Therefore, highly sensitive piezoelectric properties are exhibited at room temperature as well as in a specific high-temperature range ($T_{rt}$° C. to ($T_{rt}$−20)° C.).

Consequently, the piezoelectric devices including these crystals exhibit characteristics similar to those in the first and second embodiments.

According to the exemplary piezoelectric single crystal device of the present invention, it becomes possible to provide a piezoelectric single crystal device exhibiting excellent piezoelectric properties, particularly at temperatures higher than room temperature, specifically within a specific high-temperature range of $T_{rt}$° C. to ($T_{rt}$−20)° C. (for example, about 50° C. to 70° C.) where $T_{rt}$ represents a transformation temperature between a pseudocubic system and a tetragonal system. Furthermore, since excellent piezoelectric properties are exhibited also at room temperature, stable piezoelectric properties can be exhibited with high sensitivity even when the piezoelectric single crystal device is used within a wide temperature range, for example, from room temperature to the specific high-temperature range described above.

TABLE 1

| | | Specific inductive capacity | | |
|---|---|---|---|---|
| Sample No. | PbTiO$_3$ (mol %) | $\epsilon r^{25}$ room temperature 25 deg C. | $\epsilon r^{Trt}$ pseudocubic system to tetragonal system transformation temperature (Trt) | $\epsilon r^{Trt}/\epsilon r^{25}$ |
| 1 | 26.7 | 5395 | 13335 | 2.47 |
| 2 | 27.0 | 7945 | 25218 | 3.17 |
| 3 | 27.8 | 7599 | 25452 | 3.35 |
| 4 | 28.3 | 7820 | 24936 | 3.19 |
| 5 | 29.0 | 7821 | 22520 | 2.88 |
| 6 | 30.0 | 5931 | 10321 | 1.74 |

TABLE 2

| | | Specific inductive capacity | | |
|---|---|---|---|---|
| Sample No. | PbTiO$_3$ (mol %) | $\epsilon r^{25}$ room temperature 25 deg C. | $\epsilon r^{Trt}$ pseudocubic system to tetragonal system transformation temperature (Trt) | $\epsilon r^{Trt}/\epsilon r^{25}$ |
| 1 | 25.3 | 4860 | 11216 | 2.31 |
| 2 | 25.6 | 7176 | 35491 | 4.95 |
| 3 | 26.8 | 6815 | 33074 | 4.85 |
| 4 | 27.9 | 7452 | 34313 | 4.60 |
| 5 | 29.0 | 5973 | 33201 | 5.56 |
| 6 | 30.0 | 4547 | 10908 | 2.40 |

TABLE 3

| | | | | Specific inductive capacity | | |
|---|---|---|---|---|---|---|
| Sample No. | Value of X of PbTiO$_3$ | Molar fraction of Pb (In$_{1/2}$Nb$_{1/2}$)O$_3$ (mol %) | Ca in composition (mol %) | $\epsilon r^{25}$ room temperature 25 deg C. | $\epsilon r^{Trt}$ pseudocubic system to tetragonal system transformation temperature (Trt) | $\epsilon r^{Trt}/\epsilon r^{25}$ |
| 1 | 27.8 | 0.05 | 0.0 | 7329 | 26327 | 3.59 |
| 2 | 27.8 | 5.0 | 0.0 | 7583 | 27368 | 3.61 |
| 3 | 27.8 | 10.0 | 0.0 | 7611 | 26713 | 3.51 |
| 4 | 27.8 | 15.0 | 0.0 | 7683 | 24308 | 3.16 |
| 5 | 27.8 | 20.0 | 0.0 | 7437 | 25341 | 3.41 |
| 6 | 27.8 | 30.0 | 0.0 | 7386 | 24863 | 3.37 |
| 7 | 27.8 | 15.0 | 0.05 | 7562 | 24682 | 3.26 |
| 8 | 27.8 | 15.0 | 2.0 | 7439 | 25307 | 3.40 |
| 9 | 27.8 | 15.0 | 5.0 | 7524 | 25178 | 3.35 |

TABLE 3-continued

| Sample No. | Value of X of $PbTiO_3$ | Molar fraction of Pb $(In_{1/2}Nb_{1/2})O_3$ (mol %) | Ca in composition (mol %) | $\epsilon r^{25}$ room temperature 25 deg C. | $\epsilon r^{Trt}$ pseudocubic system to tetragonal system transformation temperature (Trt) | $\epsilon r^{Trt}/\epsilon r^{25}$ |
|---|---|---|---|---|---|---|
| 10 | 27.8 | 15.0 | 7.5 | 7376 | 24698 | 3.35 |
| 11 | 27.8 | 15.0 | 10.0 | 7412 | 24108 | 3.25 |

TABLE 4

| Sample No. | Value of X of $PbTiO_3$ | Molar fraction of Pb $(In_{1/2}Nb_{1/2})O_3$ (mol %) | Ca in composition (mol %) | $\epsilon r^{25}$ room temperature 25 deg C. | $\epsilon r^{Trt}$ pseudocubic system to tetragonal system transformation temperature (Trt) | $\epsilon r^{Trt}/\epsilon r^{25}$ |
|---|---|---|---|---|---|---|
| 1 | 26.8 | 0.05 | 0.0 | 6893 | 30189 | 4.38 |
| 2 | 26.8 | 5.0 | 0.0 | 6873 | 31503 | 4.58 |
| 3 | 26.8 | 10.0 | 0.0 | 6901 | 31422 | 4.55 |
| 4 | 26.8 | 15.0 | 0.0 | 7037 | 32107 | 4.56 |
| 5 | 26.8 | 20.0 | 0.0 | 7324 | 32486 | 4.44 |
| 6 | 26.8 | 30.0 | 0.0 | 7186 | 31860 | 4.43 |
| 7 | 26.8 | 15.0 | 0.05 | 7123 | 31895 | 4.48 |
| 8 | 26.8 | 15.0 | 2.0 | 7054 | 30782 | 4.36 |
| 9 | 26.8 | 15.0 | 5.0 | 7169 | 32078 | 4.47 |
| 10 | 26.8 | 15.0 | 7.5 | 7283 | 31796 | 4.37 |
| 11 | 26.8 | 15.0 | 10.0 | 7127 | 31566 | 4.43 |

What is claimed is:

1. A piezoelectric single crystal device, comprising:
a single crystal having a composition represented by $[Pb(Mg,Nb)O_3]_{(1-X)} \cdot [PbTiO_3]_{(X)}$, where X is within the range of 0.26 to 0.29 and having a complex perovskite structure
a specific inductive capacity of the single crystal at 25° C. being 5,000 or more; and
a specific inductive capacity of the single crystal at a transformation temperature between a pseudocubic system and a tetragonal system of the single crystal being 2.5 times or more larger than the specific inductive capacity at 25° C.

2. The piezoelectric single crystal device according to claim 1, wherein a molar ratio of Mg to Nb in the single crystal is within the range of 0.45 to 0.55.

3. The piezoelectric single crystal device according to claim 1, wherein the specific inductive capacity at the transformation temperature between a pseudocubic system and a tetragonal system of the single crystal is 20,000 or more.

4. The piezoelectric single crystal device according to claim 1, the piezoelectric single crystal device formed by polarizing the single crystal of pseudocubic system in a <100> direction, wherein X is within the range of 0.27 to 0.29, and the specific inductive capacity at 25° C. is 6,500 or more.

5. The piezoelectric single crystal device according to claim 1, the piezoelectric single crystal device formed by polarizing the single crystal of pseudocubic system in a <110> direction, wherein X is within the range of 0.26 to 0.29, and the specific inductive capacity at 25° C. is 5,000 or more.

6. The piezoelectric single crystal device according to claim 1, the piezoelectric single crystal device further comprising 0.05 to 30 mole percent of lead indium niobate $[Pb(In_{1/2}Nb_{1/2})O_3]$.

7. The piezoelectric single crystal device according to claim 1, wherein 0.05 to 10 mole percent of lead in the composition of the piezoelectric single crystal device is substituted with calcium.

* * * * *